Figure 1:
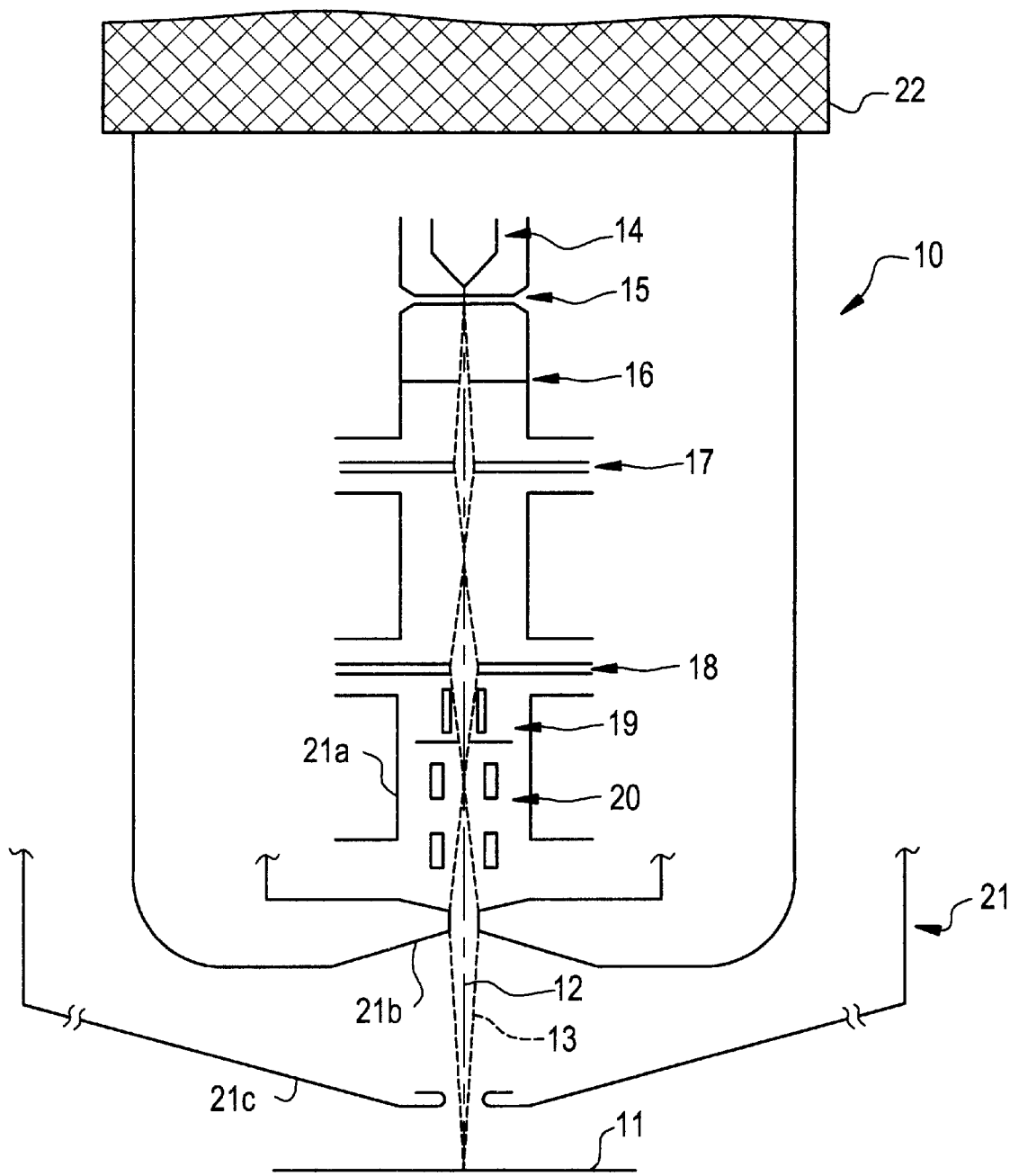

United States Patent [19]
Chisholm

[11] Patent Number: 5,998,795
[45] Date of Patent: Dec. 7, 1999

[54] ELECTRON BEAM PATTERN-WRITING COLUMN

[75] Inventor: Thomas Chisholm, Cambridge, United Kingdom

[73] Assignee: Leica Microsystems Lithography Limited, Cambridge, United Kingdom

[21] Appl. No.: 08/894,823

[22] PCT Filed: Dec. 11, 1996

[86] PCT No.: PCT/EP96/05528

§ 371 Date: Aug. 29, 1997

§ 102(e) Date: Aug. 29, 1997

[87] PCT Pub. No.: WO97/25735

PCT Pub. Date: Jul. 17, 1997

[30] Foreign Application Priority Data

Jan. 5, 1996 [GB] United Kingdom ................ 96 00 166

[51] Int. Cl.⁶ .................................................. H01J 37/244
[52] U.S. Cl. ...................................... 250/398; 250/396 R
[58] Field of Search ............................... 250/398, 396 R, 250/310, 492.22, 492.23, 492.2, 492.3

[56] References Cited

U.S. PATENT DOCUMENTS 4,675,524  6/1987  Frosien et al. ........................... 250/310

FOREIGN PATENT DOCUMENTS 0 462 554  12/1991  European Pat. Off. .
522195  6/1940  United Kingdom .

Primary Examiner—Kiet T. Nguyen
Attorney, Agent, or Firm—Foley & Lardner

[57] ABSTRACT

An electron beam pattern-writing column comprises an emitter and an extractor (14, 15) for generating a low-energy electron beam (13), a series of three electrostatic triple element lenses (17, 18, 21) for focussing the beam, and an electrostatic double deflector (20), which is disposed ahead of the final lens (21), for deflecting the beam to scan a substrate (11) on which a pattern is to be written. After focussing and deflection of the beam have been carried out by the electrostatic components, which are low power and thus have no significant heat output, the beam electrons are accelerated by the final element (21c) of the final lens (21) into a high-energy beam with the required strength for high-quality pattern writing.

11 Claims, 1 Drawing Sheet

ELECTRON BEAM PATTERN-WRITING COLUMN

The present invention relates to an electron beam pattern-writing column.

Electron beam columns are used in electron beam pattern-writing or microfabrication machines which serve for writing on substrates, for example writing circuit patterns on masks coated with electron-sensitive resists (lithography) or direct writing of such patterns on wafers. It is common practice to utilise a high-energy beam with an electron acceleration potential of 50 to 100 kilo electron volts, or even more, to achieve good penetration of the resist and to minimise proximity effects arising from backscatter of secondary electrons by the substrate. However, the electron speed in high-energy beams is so high that the beams are relatively difficult to focus and deflect and electromagnetic lenses and electromagnetic deflecting systems are usually required for these purposes. If electrostatic lenses of the kind used in low-energy beams were to be considered, the potential of the focussing electrode in each such lens would have to be close to that of the beam emitter and the consequent demands of insulation and spacing would require the lenses to be very large.

A problem with electromagnetic lenses, however, is that they are bulky, heavy, consume a considerable amount of power and generate heat due to the excitation current in the lens coils. Each lens may have a heat output in the region of 30 to 40 watts, which can cause distortion of the beam column and thus lead to beam position error. This is highly detrimental in view of the criticality of tolerances in circuit writing on very small substrates. The effect of heat dissipation is controllable to some extent by water cooling via coolant channels in the column casing. Even with cooling it remains difficult to deal with changes in thermal influence when a lens is replaced by another with a different heat output. The change in thermal influence results in a change in the column performance.

In GB 522 195 there is disclosed a television cathode ray tube with a single upstream focussing lens and a downstream final lens serving for electron beam deflection. The beam electrons are accelerated after the deflection, but the beam remains a low-energy beam, undergoing merely a threefold increase from 6.5 to 20 keV. The amount of increase is critical and has to be kept below a value at which distortion of the television screen raster image occurs. Because only a single upstream focussing lens is present, specific problems connected with beam focussing, in particular lens spacing and insulation, do not have to be addressed. Moreover, a beam with a low final energy of the level referred to in GB 522 195 could not meet current demands with respect to pattern-writing accuracy and definition.

Electron beam apparatus usable for, inter alia, lithography purposes and incorporating electrostatic lenses is disclosed in EP-A 0 462 554. This apparatus, too, provides a low-energy beam and consequently is subject to the same limitations with respect to pattern-writing quality. The beam is accelerated during passage along the electron beam column but is decelerated at a final lens which contains a final electrode supplied with an acceleration voltage at least three times less than that supplied to a first electrode of the lens. Ultimately, there is only very low-energy beam action on a substrate on which pattern writing is to be carried out.

Apart from the beam electron accelerations performed in the apparatus described in these two documents, it is known to convert low-energy beams into high-energy beams in cathode ray tubes of oscilliscopes, but not for reasons of mitigating heat effect. Such tubes do not contain series of focussing lenses.

It is therefore the object of the present invention to provide an electron beam column which is suitable for extremely fine and accurate scanning, but in which the mentioned disadvantages of prior art columns, in particular heat output from focussing components and the accompanying need for cooling measures, can be eliminated or at least significantly reduced in effect.

Other objects and advantages of the invention will be apparent from the following description.

According to the present invention there is provided an electron beam pattern-writing column comprising generating means for generating an electron beam, a series of lenses for focussing the beam and deflecting means for controlled deflection of the beam for the purpose of scanning a substrate on which a pattern is to be written, characterised in that the generating maens is operable to generate a low-energy beam, each of the lenses is electrostatic and the final lens of the series is operable to accelerate the beam electrons to convert the beam from a low-energy beam into a high-energy beam in which the latter has an electron acceleration potential substantially 5 to 100 times that of the former.

Because the beam has low energy, in particular less than about 10 keV, prior to acceleration by the final lens, it is possible to use electrostatic lenses which can be light and small in size and which require only a relatively low operating current for focussing purposes and thus have a low heat output. Cooling of the column specifically to combat heat from the lenses is no longer necessary. In a three lens column the spacing of the first lens of the series from an emitter of the beam-generating means and the spacing of the first and second lenses of the series from each other can be kept small and thus the column can be relatively short. Apart from the advantage of compactness, the short length reduces exposure to external influences such as temperature changes in the environment of the column. The final acceleration of the beam to a high energy, in particular at least about 50 keV, means that the advantages of good resist penetration and reduced susceptibility to proximity effect are retained.

For preference the deflecting means is arranged to deflect the beam prior to the final lens and is also electrostatic, so that there is no significant heat output from this source.

The electron acceleration potential of the high-energy stage of the beam is preferably 10 to 20 times that of the low-energy stage of the beam, for example the former can be about 5 keV and the latter about 100 keV. An energy relationship of this order of magnitude means that the beam prior to acceleration to its final energy value can be readily focussed and deflected by electrostatic components and after acceleration can carry out pattern writing with the same efficacy as a column providing a wholly high-energy beam.

The final lens is preferably a triple element lens with unequal diameter elements, in which the smallest diameter element can be caused to have a low potential corresponding to the acceleration potential of the low-energy stage of the beam, the largest diameter element a high potential corresponding to the acceleration potential of the high-energy stage and the intermediate diameter element a variable low potential. The intermediate diameter element of the final lens can be formed as a casing enclosing the generating means, the or each other lens of the series, the deflecting means and the smallest diameter element of the final lens, and can be supported by a high voltage insulator. The insulator in that case can be provided with passages for supply lines to the lenses and deflecting means.

An embodiment of the invention will now be described in more detail with reference to the accompanying drawing, the single FIGURE of which is a schematic elevation of an electron beam column embodying the invention.

Referring now to the drawing there is shown an electron beam column 10 which is incorporated in an electron beam lithography machine equipped with a movable writing stage disposed below the column. A substrate 11, for example a mask with an electron-sensitive surface on which a pattern such as an integrated circuit is to be written, is mounted in a holder on the stage and positioned, by movement of the stage, in a desired location with the principal axis 12 of the column intersecting the substrate. A focussed beam 13 is generated by the column and controlled deflection of the beam is carried out to cause the beam to scan the substrate surface in correspondence with the pattern, whereby the pattern is duplicated on the surface by the action of the beam electrons. Usually, the pattern is fractured into fields or strips and written one field or strip at a time by scanning individual sections of the substrate surface. The stage is moved to bring the sections in succession into a writing position.

In the case of the column 10 embodying the invention, the emitted beam 13 consists of a low-energy stage which is focussed and deflected in accordance with the pattern writing requirements and then finally accelerated to provide a high-energy output. In detail, the column comprises beam-generating means in the form of a Schottky emitter operating at a high negative voltage in conjunction with an electron extractor 15 having a potential of about 6 kilovolts with respect to the emitter. The extractor is followed by a beam-limiting aperture 16 to contain the electron spread and the aperture is followed by a first lens 17 and a second lens 18. Each of the lenses 17 and 18 is a unipotential, triple element electrostatic lens, in which the potential of the centre element can be varied, in the range of zero to several hundred volts relative to the emitter voltage, for the purpose of focussing the beam to obtain a desired spot diameter on the substrate surface. The lenses 17 and 18 thus function as "zoom" lenses able to provide variable magnification of the image of the source.

Because the lenses 17 and 18 can be structured to focus only a low-energy beam, in this example with an electron acceleration potential of 6 kilo electron volts, they can be relatively small in size and located close to the emitter 14. The spacing between the emitter and the lens 17 can be about 25 millimeters and the spacing between the lens 17 and the lens 18 about 50 millimeters.

After passage through the lenses 17 and 18 the beam is directed to a blanking device 19 consisting of two plates, to which different voltages are applied, and an apertured plate. Increase in the voltage difference between the plates causes deflection of the beam away from the plate aperture so that onward transmission of the beam is blocked during the times in which, for example, the substrate 11 is to be repositioned by stage movement. The beam then passes through an electrostatic double deflector 20 in which, by application of different voltages to two parallel plates, the beam is controllably deflected away from and subsequently back towards the axis 12 in dependence on the features of the pattern being written.

The column is completed by a third and final electrostatic lens 21 which consists of three cylindrical elements of progressively increasing diameter. The first and smallest diameter element 21a can lie at the extractor potential of 6 kilovolts, the centre and intermediate diameter element 21b at a variable potential of, for example, about 8.9 kilovolts and the final and largest diameter element 21c at a potential of 100 kilovolts with respect to the emitter. By virtue of these voltage relationships the final lens 21 serves not only to focus the beam, but also to accelerate the beam electrons to convert the beam into one of high energy with an electron accelerating potential of 100 kilo electron volts. The final element 21c is disposed as close as practicable to the substrate 11, which together with the element 21c is at ground potential, to minimise loss in beam spot quantity due to chromatic aberration of the final lens. In the case of a beam semi-angle into the substrate of 1 milliradian, a spot size of about 5 nanometers could be achieved at the axis 12, with an increase to about 15 nanometers at the corner of a 200 micron deflection field. The drive voltage of the electrostatic deflector 20 to achieve a deflection field of that size would then be about plus or minus 40 volts.

The centre element 21b of the final lens 21 is extended to form a casing for all the low-energy components of the column and is supported by a 100 kilovolt insulator 22. The insulator has feedthrough passages for power supply lines to the operating components within the casing.

The column 10 described above, with final conversion of a low-energy beam into a high-energy beam, may achieve the same levels of imaging by use of electrostatic lenses as in the case of electromagnetic lenses present in a wholly high-energy column, but with no measurable heat output from the lenses. A source of undesired thermal influence on the column operation can thus be eliminated.

I claim:

1. An electron beam pattern-writing column comprising generating means for generating an electron beam, a series of lenses for focussing the beam and deflecting means for controlled deflection of the beam for the purpose of scanning a substrate on which a pattern is to be written, characterised in that the generating means is operable to generate a low-energy beam, each of the lenses is electrostatic and the final lens of the series is operable to accelerate the beam electrons to convert the beam from a low-energy beam into a high-energy beam in which the latter has an electron acceleration potential substantially 5 to 100 times that of the former.

2. A column according to claim 1, characterised in that the series of lenses comprises two lenses for focussing the beam ahead of the final lens.

3. A column according to claim 2, characterised in that each of the lenses ahead of the final lens is operable to vary beam spot diameter on the substrate.

4. A column according to claim 1 characterised in that the deflecting means is arranged to deflect the beam prior to the final lens and is electrostatic.

5. A column according to claim 1 characterised in that the electron acceleration potential of the high-energy stage of the beam is substantially 10 to 20 times that of the low energy stage of the beam.

6. A column according to claim 1 characterised in that the electron acceleration potential of the low-energy stage of the beam is substantially 6 kilo electron volts and that of the high-energy stage of the beam is substantially 100 kilo electron volts.

7. A column according to claim 1 characterised in that the final lens is a triple element lens with unequal diameter elements.

8. A column according to claim 7, characterised by means to cause the smallest diameter element of the final lens to have a low potential corresponding to the acceleration potential of the low-energy stage of the beam, the largest diameter element to have a high potential corresponding to the acceleration potential of the high-energy stage of the beam and the intermediate diameter element to have a variable low potential.

9. A column according to claim 7 characterised in that the intermediate diameter element of the final lens is formed as a casing enclosing the generating means, the remaining lens or lenses of the series, the deflecting means and the smallest diameter element of the final lens.

10. A column according to claim 9, characterised by a high voltage insulator supporting the casing and column components contained therein.

11. A column according to claim 10, wherein the insulator is provided with passages for supply lines to the lenses and deflecting means.

* * * * *